US012648387B2

(12) United States Patent
Nakamura

(10) Patent No.: US 12,648,387 B2
(45) Date of Patent: *Jun. 2, 2026

(54) METHOD OF PROCESSING WAFER INCLUDING A FIRST RESIN APPLYING STEP AND A SECOND RESIN APPLYING STEP

(71) Applicant: DISCO CORPORATION, Tokyo (JP)

(72) Inventor: Masaru Nakamura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 707 days.

This patent is subject to a terminal disclaimer.

(21) Appl. No.: 17/809,704

(22) Filed: Jun. 29, 2022

(65) Prior Publication Data

US 2023/0025741 A1    Jan. 26, 2023

(30) Foreign Application Priority Data

Jul. 20, 2021    (JP) ................................. 2021-119467

(51) Int. Cl.
*H10P 54/00*        (2026.01)
*H10P 52/00*        (2026.01)
(Continued)

(52) U.S. Cl.
CPC .............. *H10P 54/00* (2026.01); *H10P 52/00* (2026.01); *H10P 95/062* (2026.01); *H10W 74/01* (2026.01)

(58) Field of Classification Search
CPC . H01L 21/78; H01L 21/304; H01L 21/31053; H01L 21/56
See application file for complete search history.

(56) References Cited

U.S. PATENT DOCUMENTS

2007/0057378 A1* 3/2007 Arai ....................... B23K 26/40
                                                                257/777
2008/0176491 A1    7/2008 Sekiya
(Continued)

FOREIGN PATENT DOCUMENTS

JP        2004188475 A        7/2004
JP        2008182015 A        8/2008
(Continued)

OTHER PUBLICATIONS

Bajpai, Madhu, et al., "Film performance and UV curing of epoxy acrylate resins", Progress in Organic Coatings 44, pp. 271-278 (Year: 2002).*

(Continued)

*Primary Examiner* — Fernando L Toledo
*Assistant Examiner* — Ryan T. Fortin
(74) *Attorney, Agent, or Firm* — GREER BURNS & CRAIN, LTD.

(57)        ABSTRACT

A method of processing a wafer having a plurality of devices formed in respective areas on a face side of the wafer, the areas being demarcated by a plurality of intersecting projected dicing lines, includes a low-viscosity resin applying step of coating the face side of the wafer with a first liquid resin of low viscosity to cover an area of the wafer where the plurality of devices are present, a high-viscosity resin applying step of, after the low-viscosity resin applying step, coating the face side of the wafer with a second liquid resin of higher viscosity than the first liquid resin in overlapping relation to the first liquid resin, a resin curing step of curing the first liquid resin and the second liquid resin that have coated the face side of the wafer into a protective film, and a planarizing step of planarizing the protective film.

14 Claims, 9 Drawing Sheets

(51) Int. Cl.
    *H10P 95/00*      (2026.01)
    *H10W 74/01*      (2026.01)

(56)          References Cited

U.S. PATENT DOCUMENTS

| | | | | |
|---|---|---|---|---|
| 2010/0129546 A1* | 5/2010 | Kitahara | ........... | H01L 21/68728 |
| | | | | 118/52 |
| 2012/0015522 A1* | 1/2012 | Arita | ................... | H01L 21/6835 |
| | | | | 257/E21.218 |
| 2012/0021608 A1* | 1/2012 | Arita | ....................... | H01L 21/78 |
| | | | | 438/703 |
| 2012/0080138 A1 | 4/2012 | Yew | | |
| 2012/0244663 A1* | 9/2012 | Mori | ....................... | H01L 24/92 |
| | | | | 257/E21.599 |
| 2017/0352637 A1 | 12/2017 | Yasuda et al. | | |
| 2018/0182715 A1* | 6/2018 | Kim | ....................... | H01L 21/568 |
| 2018/0211926 A1* | 7/2018 | Jang | ................... | H01L 23/3128 |
| 2023/0015352 A1 | 1/2023 | Nakamura | | |

FOREIGN PATENT DOCUMENTS

| | | | | | |
|---|---|---|---|---|---|
| JP | 2012209419 A | 10/2012 | | | |
| JP | 2013021017 A | 1/2013 | | | |
| JP | 2013-069886 A | 4/2013 | | | |
| JP | 2013-080972 A | 5/2013 | | | |
| JP | 2014078569 A | 5/2014 | | | |
| JP | 2014124648 A | 7/2014 | | | |
| JP | 2014-165462 A | 9/2014 | | | |
| JP | 2017005056 A | 5/2017 | | | |
| JP | 2017157749 A | 9/2017 | | | |
| JP | 2017220669 A | 12/2017 | | | |
| JP | 2018029097 A | 2/2018 | | | |
| JP | 2018-064078 A | * | 4/2018 | ............. | H01L 21/50 |
| JP | 6616174 B2 | 12/2019 | | | |
| JP | 2021068778 A | 4/2021 | | | |

OTHER PUBLICATIONS

Office Action issued in counterpart German patent application No. 10 2022 207 160.3, dated May 16, 2024.

Office Action issued in counterpart German patent application No. 10 2022 206 947.1, dated Jul. 29, 2024.

Office Action issued by the Japanese Patent Office for corresponding JP Patent Application No. 2001-117538, mailed Mar. 4, 2025.

Nakamura, Masaru, U.S. Appl. No. 17/809,701, filed Jun. 29, 2022.

Office Action issued in counterpart Japanese patent application No. 2021-119467, dated Mar. 4, 2025.

Office Action issued in counterpart Taiwanese patent application No. 111124525, dated Jul. 18, 2025.

\* cited by examiner

FIG.5A
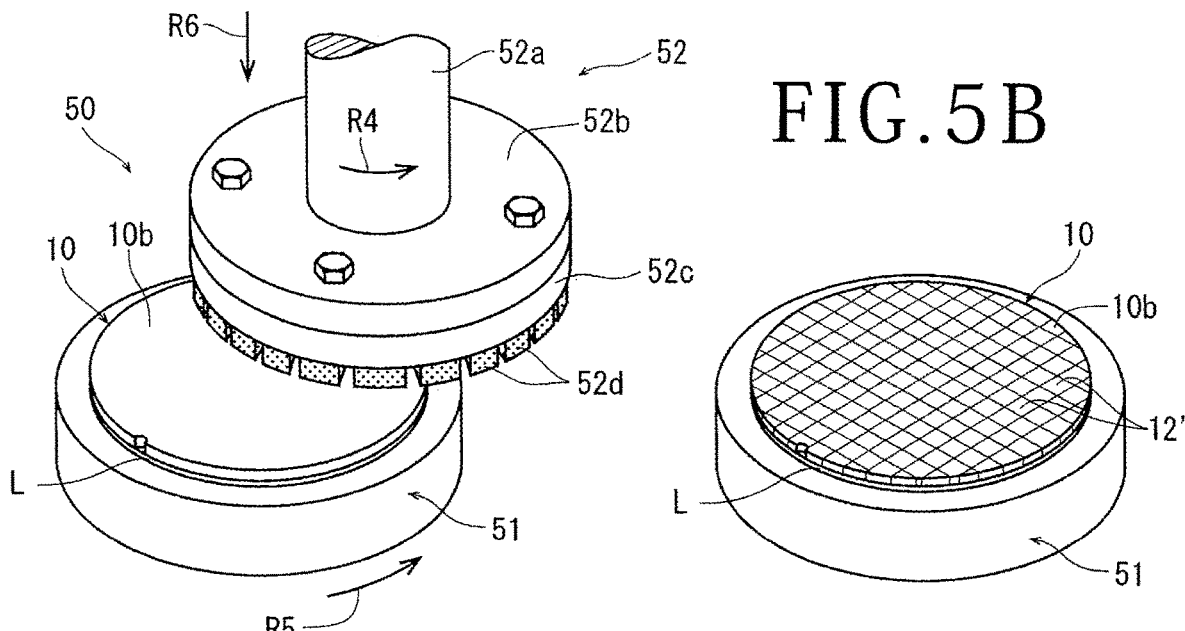
FIG.5B
FIG.6
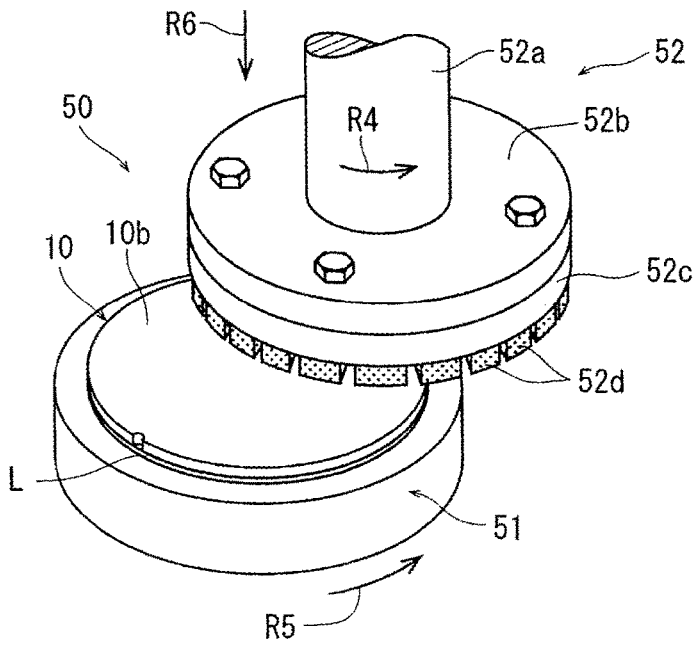

METHOD OF PROCESSING WAFER INCLUDING A FIRST RESIN APPLYING STEP AND A SECOND RESIN APPLYING STEP

BACKGROUND OF THE INVENTION

Field of the Invention

The present invention relates to a method of processing a wafer having a plurality of devices formed in respective areas on a face side of the wafer, the areas being demarcated by a plurality of intersecting projected dicing lines established thereon.

Description of the Related Art

Wafers with a plurality of devices such as integrated circuits (ICs) or large-scale integrated (LSI) circuits formed in respective areas on a face side of the wafer, the areas being demarcated by a plurality of intersecting projected dicing lines established thereon, are divided by a dicing apparatus into individual device chips. The divided device chips are used in electric appliances such as mobile phones and personal computers.

There has been proposed in the art a technology for applying a laser beam whose wavelength is transmittable through a wafer to the wafer while positioning the focused spot of the laser beam within the wafer at positions aligned with projected dicing lines on a face side of the wafer, thereby forming modified layers in the wafer, thereafter grinding a reverse side of the wafer to thin down the wafer to a desired thickness, and then dividing the wafer into individual device chips at the modified layers along the projected dicing lines (see, for example, JP 2014-078569A).

There has also been proposed in the art a technology for applying a laser beam whose wavelength is absorbable by a wafer to the wafer while positioning the focused spot of the laser beam at projected dicing lines on the wafer, thereby forming grooves in the wafer by way of laser ablation, and then dividing the wafer into individual device chips at the grooves along the projected dicing lines (see, for example, JP 2004-188475A).

SUMMARY OF THE INVENTION

Some wafers have devices formed thereon that include surface irregularities on face sides thereof, i.e., protrusive electrodes, called "bumps," for example. If such a wafer is processed according to the technology disclosed in JP 2014-078569A to grind a reverse side of the wafer while a face side of the wafer is covered with a protective film that embeds the bumps, then swarf tends to enter between the devices and the protective film on the individual device chips, possibly contaminating the bumps.

It is assumed that the technology disclosed in JP 2004-188475A is applied to a wafer with bumps as described above and the face side of the wafer is coated with a protective film of liquid resin. When the wafer is processed by laser ablation with a laser beam having a wavelength that is absorbable by the wafer while the focused spot of the laser beam is positioned on the face side of the wafer along the projected dicing lines, the protective film tends to be peeled off, allowing debris to be directly deposited on face sides of the device chips and lowering the quality of the device chips.

It is therefore an object of the present invention to provide a method of processing a wafer that has protrusions on a face side thereof while preventing the wafer from being broken or damaged and also preventing device chips produced from the wafers from being lowered in quality by debris which would directly be deposited on face sides of the device chips.

In accordance with an aspect of the present invention, there is provided a method of processing a wafer having a plurality of devices formed in respective areas on a face side of the wafer, the areas being demarcated by a plurality of intersecting projected dicing lines. The method includes a low-viscosity resin applying step of coating the face side of the wafer with a first liquid resin of low viscosity to cover an area of the wafer where the plurality of devices are present, a high-viscosity resin applying step of, after the low-viscosity resin applying step, coating the face side of the wafer with a second liquid resin of higher viscosity than the first liquid resin in overlapping relation to the first liquid resin, a resin curing step of curing the first liquid resin and the second liquid resin that have coated the face side of the wafer into a protective film, and a planarizing step of planarizing the protective film.

Preferably, the planarizing step includes the steps of holding a reverse side of the wafer on a chuck table, exposing the face side of the wafer, and cutting the protective film to planarize the protective film with a cutting unit having a single-point cutting tool.

Preferably, the method further includes a modified layer forming step of forming modified layers in the wafer along the respective projected dicing lines by applying a laser beam having a wavelength transmittable through the wafer to the wafer from the reverse side of the wafer along the projected dicing lines while positioning a focused spot of the laser beam within the wafer, and a dividing step of grinding the reverse side of the wafer with grindstones to finish the wafer to a predetermined thickness and dividing the wafer into individual device chips along the modified layers. Preferably, the method further includes a grinding step of grinding the reverse side of the wafer with grindstones to finish the wafer to a predetermined thickness, a modified layer forming step of forming modified layers in the wafer along the respective projected dicing lines by applying a laser beam having a wavelength transmittable through the wafer to the wafer from the reverse side of the wafer along the projected dicing lines while positioning a focused spot of the laser beam within the wafer, and a dividing step of dividing the wafer into individual device chips by exerting external forces to the wafer.

Preferably, the method further includes a laser ablation step of performing laser ablation on the wafer along the projected dicing lines by positioning a focused spot of a laser beam having a wavelength absorbable by the wafer on the face side of the wafer along the projected dicing lines and applying the laser beam to the wafer. Preferably, the method further includes a groove forming step of, before the low-viscosity resin applying step, forming grooves in the wafer along the respective projected dicing lines on the face side of the wafer. The low-viscosity resin applying step, the high-viscosity resin applying step, the resin curing step, and the planarizing step are carried out after the groove forming step. A dividing step of grinding the reverse side of the wafer with grindstones to finish the wafer to a predetermined thickness and dividing the wafer into individual device chips by exposing the grooves is carried out after the planarizing step.

With the method of processing a wafer according to the present invention, even if protrusions are present on the face side of the wafer, the wafer can be divided into individual device chips without being broken or damaged, and the device chips are prevented from being lowered in quality by debris which would directly be deposited on the face sides of the device chips.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 5A is a perspective view illustrating the manner in which a dividing step of dividing the wafer into individual device chips at modified layers is carried out;

FIG. 5B is a perspective view illustrating the wafer that has been divided into individual device chips in the dividing step;

FIG. 6 is a perspective view illustrating the manner in which a grinding step of grinding a reverse side of the wafer with grindstones is carried out;

FIG. 11A is a perspective view illustrating the manner in which a groove forming step is carried out;

FIG. 11B is an enlarged fragmentary cross-sectional view of the wafer illustrated in FIG. 11A;

FIG. 11C is a perspective view of the wafer in which grooves have been formed in the groove forming step;

FIG. 12 is a perspective view illustrating the manner in which a dividing step of grinding the reverse side of the wafer by grindstones to divide the wafer into individual device chips is carried out;

DETAILED DESCRIPTION OF THE PREFERRED EMBODIMENT

A method of processing a wafer as a workpiece according to a preferred embodiment of the present invention will be described in detail hereinbelow with reference to the drawings.

Figures 1A, 1B, 1C:
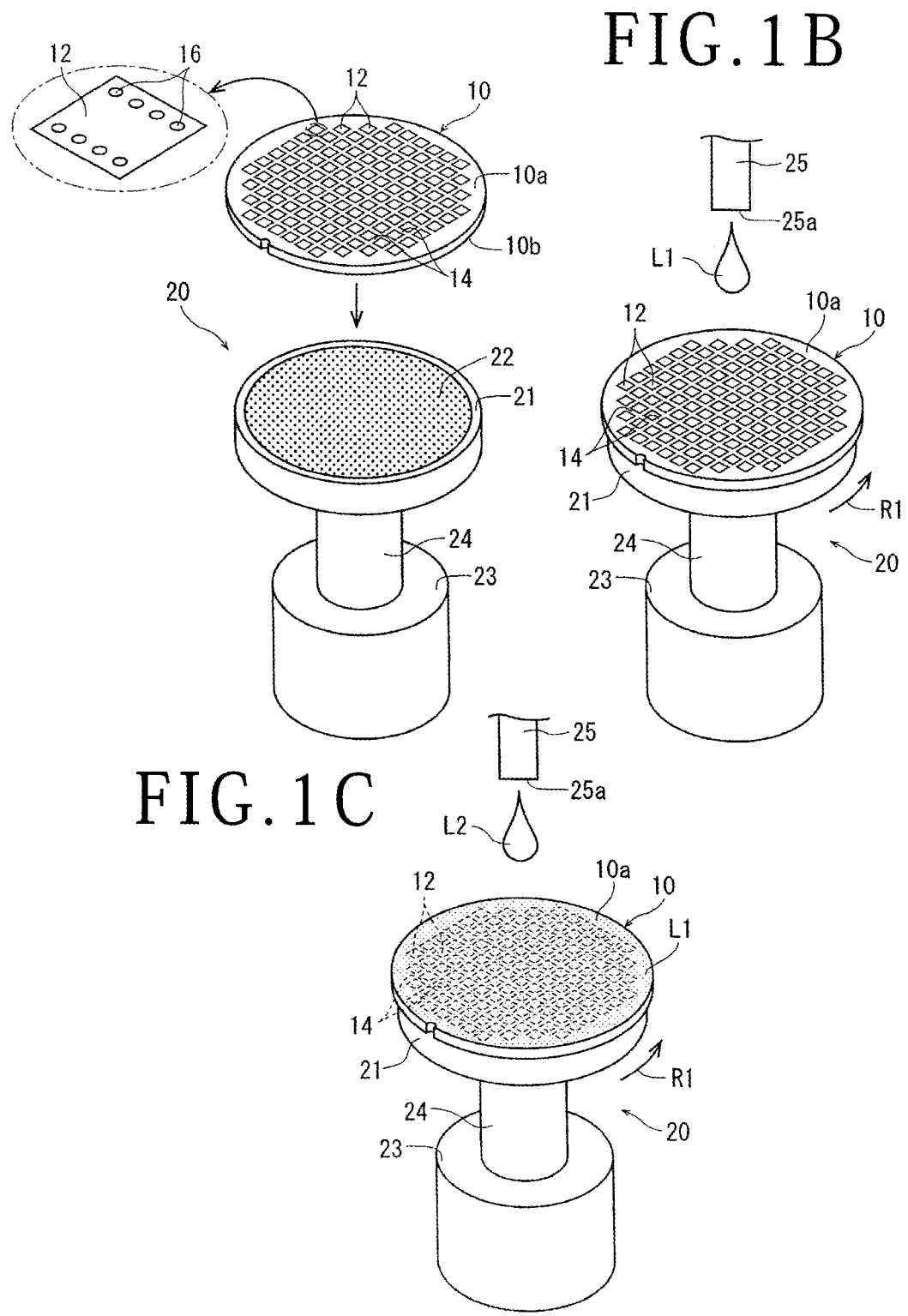
FIG. 1A is a perspective view of a wafer as a workpiece and an apparatus for coating the workpiece with a liquid resin.
FIG. 1B is a perspective view illustrating the manner in which a low-viscosity resin applying step is carried out.
FIG. 1C is a perspective view illustrating the manner in which a high-viscosity resin applying step is carried out.

FIG. 1A illustrates a wafer 10 to be processed by the method of processing a wafer according to the present embodiment and an apparatus 20, partly illustrated, for coating the wafer 10 with a liquid resin. The wafer 10 is a silicon wafer, for example. The wafer 10 has a plurality of devices 12 formed in respective areas on a face side 10a of the wafer 10, the areas being demarcated by a plurality of intersecting projected dicing lines 14. Each of the devices 12 has a plurality of bumps 16 on its face side, as illustrated at an enlarged scale in an upper inset in FIG. TA. The bumps 16 are protrusive electrodes for electric connection to outer circuits, and are made of an alloy of lead and tin as major components, for example.

In the method of processing a wafer according to the present embodiment, a low-viscosity resin applying step is initially carried out to coat the face side 10a of the wafer 10 with a first liquid resin L1 to be described below, to cover an area of the wafer 10 where the devices 12 are present, and after the low-viscosity resin applying step, a high-viscosity resin applying step is carried out to coat the face side 10a of the wafer 10 with a second liquid resin L2 that is higher in viscosity than the first liquid resin L1, in overlapping relation to the first liquid resin L1.

Specifically, the wafer 10 is first delivered to the apparatus 20 for coating the wafer 10 with the liquid resin. The apparatus 20 includes at least a chuck table 21 and a support base 23. The chuck table 21 has an upper holding surface 22 made of an air-permeable porous material. The chuck table 21 is connected to suction means, not illustrated, that, when actuated, generates and transmits a negative pressure to the holding surface 22. The support base 23 houses therein an electric motor, not illustrated, for rotating a rotational shaft 24 about its central axis to rotate the chuck table 21 that is mounted on an upper end of the rotational shaft 24.

The wafer 10 delivered to the apparatus 20 is placed on the chuck table 21 while the face side 10a of the wafer 10 is facing upwardly and a reverse side 10b thereof is facing downwardly, and then, the suction means connected to the chuck table 21 is actuated to hold the wafer 10 on the holding surface 22 under the negative pressure applied to the holding surface 22.

When the wafer 10 has been held under suction on the chuck table 21, as illustrated in FIG. 1B, a liquid resin supply nozzle 25 is positioned immediately above the center of the wafer 10. Two liquid-resin supply sources are connected to the liquid resin supply nozzle 25. Specifically, a first liquid-resin supply source, not illustrated, for supplying the first liquid resin L1 whose viscosity is lower and a second liquid-resin supply source, not illustrated, for supplying the second liquid resin L2 whose viscosity is higher than the first liquid resin L1 are connected to the liquid resin supply nozzle 25. The first liquid resin L1 and the second liquid resin L2 are an epoxy resin that can be cured upon exposure to ultraviolet rays, for example. The first liquid resin L1 is mixed with a solvent at a higher ratio than the second liquid resin L2, and hence is less viscous than the second liquid resin L2, i.e., is in a state of lower viscosity than the second liquid resin L2.

After the wafer 10 has been held under suction on the chuck table 21, as illustrated in FIG. 1B, the electric motor housed in the support base 23 is energized to rotate the rotational shaft 24 and the chuck table 21 about their central axis in the direction indicated by an arrow R1. Then, the liquid resin supply nozzle 25 supplies a predetermined amount of first liquid resin L1 from an ejection port 25a to the wafer 10 to coat the face side 10a of the wafer 10. The amount of first liquid resin L1 supplied from the ejection port 25a to the wafer 10 is set to a level that should be enough for the first liquid resin L1 applied to the face side 10a to cover an area of the wafer 10 where the devices 12 are present. The low-viscosity resin applying step is now completed.

When the low-viscosity resin applying step has been carried out, the second liquid-resin supply source, not illustrated, is connected to the liquid resin supply nozzle 25. Then, as illustrated in FIG. 1C, the electric motor housed in the support base 23 is energized to rotate the rotational shaft 24 and the chuck table 21 about their central axis in the direction indicated by the arrow R1. Then, the liquid resin supply nozzle 25 supplies a predetermined amount of second liquid resin L2 from the ejection port 25a to the wafer 10 to coat the face side 10a of the wafer 10 overlapping the previously applied first liquid resin L1. The amount of second liquid resin L2 supplied from the ejection port 25a to the wafer 10 is set to a level that should be enough for the second liquid resin L2 to cover the entire first liquid resin L1 applied to the face side 10a of the wafer 10. The high-viscosity resin applying step is now completed.

In the low-viscosity resin applying step, since the applied first liquid resin L1 is lower in viscosity, the first liquid resin L1 flows to engulf minute protrusions such as bumps, thereby covering the face side 10a of the wafer 10 without leaving clearances thereon. Further, as described above, since the second liquid resin L2 that is higher in viscosity than the first liquid resin L1 is applied in overlapping relation to the first liquid resin L1 in the high-viscosity resin applying step, the face side 10a of the wafer 10 is covered with the first liquid resin L1 and the second liquid resin L2 without leaving clearances thereon while the second liquid resin L2 harmonizes and blends well with the first liquid resin L1 that is lower in viscosity.

Figure 2:
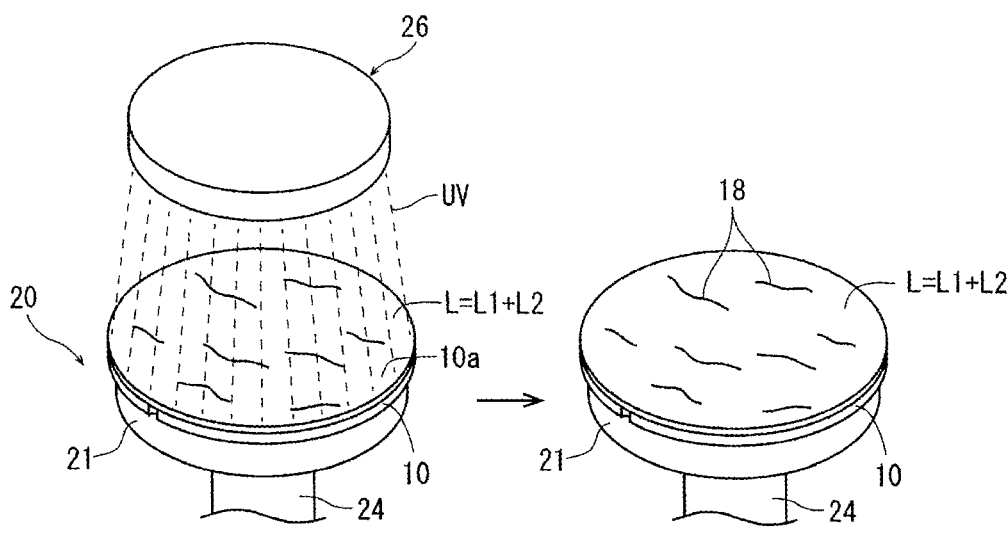
FIG. 2 is a perspective view illustrating the manner in which a resin curing step is carried out.

Then, a resin curing step is carried out to cure the first liquid resin L1 and the second liquid resin L2 applied to the wafer 10. For carrying out the resin curing step, ultraviolet ray applying means 26 illustrated in a left section of FIG. 2 is positioned immediately above the wafer 10 held by the apparatus 20. Then, the ultraviolet ray applying means 26 applies ultraviolet rays UV to the first liquid resin L1 and the second liquid resin L2 that have coated the wafer 10. When exposed to the applied ultraviolet rays UV, the first liquid resin L1 and the second liquid resin L2 are cured, forming a protective film L on the face side 10a of the wafer 10 as illustrated in a right section of FIG. 2. The resin curing step is now completed. According to the present embodiment, a resin that is curable upon exposure to the ultraviolet rays UV is selected as the first liquid resin L1 and the second liquid resin L2 on the face side 10a of the wafer 10. However, the first liquid resin L1 and the second liquid resin 12 are not limited to such a resin, and may be a resin that is curable over time, for example. If the liquid resin L1 and the second liquid resin L2 are a resin that is curable over time, then the resin applying step is followed by a standby step, as the resin curing step, where the wafer 10 is left on the chuck table 21 until the first liquid resin L1 and the second liquid resin L2 applied to the wafer 10 are cured into the protective film L. In a case where the first liquid resin L1 and the second liquid resin L2 are a water-soluble liquid resin, it is possible to produce the low-viscosity first liquid resin L1 by adding water to the high-viscosity second liquid resin L2.

The protective film L has been formed to a thickness sufficiently large to embed the bumps 16 on the devices 12. As a whole, the protective film L that contains the bumps 16 tends to have surface irregularities 18, as illustrated in the right section of FIG. 2, because the protective film L has thickness irregularities due to surface irregularities of the face side 10a of the wafer 10 and shrinkage caused when the liquid resin is cured into the protective film L. If a laser beam whose wavelength is absorbable by the wafer 10 is applied to the face side 10a of the wafer 10 to form dividing grooves in the wafer 10 along the projected dicing lines 14 by way of laser ablation, then the grooves are likely to have different depths that tend to cause a processing failure. Although an attempt may be made to hold the protective film L in position and grind the reverse side 10b of the wafer 10 to thin down the wafer 10, the wafer 10 may possibly be broken or damaged owing to the surface irregularities 18. According to the present embodiment, a planarizing step is carried out to planarize the protective film L.

Figure 3:
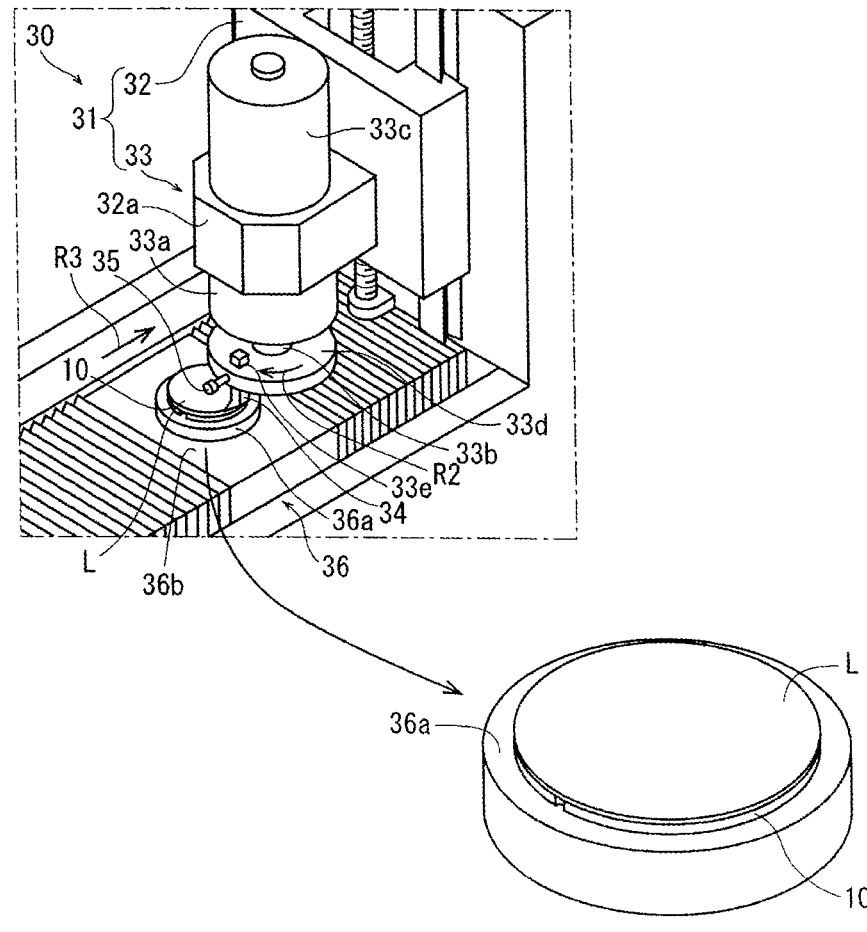
FIG. 3 is a perspective view illustrating the manner in which a planarizing step is carried out.

FIG. 3 illustrates in perspective a cutting apparatus 30, partly illustrated, that is suitable for carrying out the planarizing step. As illustrated in FIG. 3, the cutting apparatus 30 includes a cutting unit 31 mounted on an apparatus body for vertical movement. The cutting unit 31 includes a movable base 32 movable vertically by a cutting feed mechanism, not illustrated, and a spindle unit 33 mounted on the movable base 32. The spindle unit 33 is supported on the movable base 32 by a support member 32a mounted on a front surface of the movable base 32.

The spindle unit 33 includes a spindle housing 33a mounted on the support member 32a, a rotatable spindle 33b rotatably disposed in the spindle housing 33a, and a servomotor 33c as a rotary actuator for rotating the rotatable spindle 33b about its vertical central axis. The rotatable spindle 33b has a lower end portion protruding downwardly beyond a lower end of the spindle housing 33a. A single-point cutting tool mount 33d shaped as a circular plate is mounted on a lower end of the rotatable spindle 33b.

The single-point cutting tool mount 33d has a tool mount hole 33e defined therein that extends vertically through the single-point cutting tool mount 33d in an outer circumferential portion thereof that is spaced radially outwardly from the central axis of the rotatable spindle 33b. A single-point cutting tool 34 is inserted in the tool mount hole 33e and fastened in position by a fastening bolt 35 that is threaded in an internally threaded hole, not illustrated, defined laterally in the single-point cutting tool mount 33d and that has a tip end pressed against the single-point cutting tool 34. According to the present embodiment, the single-point cutting tool 34 is formed as a bar-shaped cutting tool of tool steel such as a cemented carbide alloy. The single-point cutting tool 34 has, on its lower distal end, a cutting edge made of diamond or the like. The single-point cutting tool 34 mounted on the single-point cutting tool mount 33d is rotatable in unison with the single-point cutting tool mount 33*d* when the rotatable spindle 33*b* is rotated by the servomotor 33*c*.

The cutting apparatus 30 includes a chuck table mechanism 36. The chuck table mechanism 36 includes a rotatable chuck table 36*a* shaped as a circular plate. The chuck table 36*a* has an upper holding surface made of an air-permeable porous material and connected to a suction source, not illustrated. The chuck table mechanism 36 includes a moving mechanism, not illustrated, housed in the apparatus body of the cutting apparatus 30. The moving mechanism moves the chuck table 36*a* together with a cover member 36*b* in the direction indicated by an arrow R3. In the cutting apparatus 30 illustrated in FIG. 3, the chuck table 36*a* holds the wafer 10 delivered from the apparatus 20 under suction on the holding surface thereof.

The cutting apparatus 30 illustrated in FIG. 3 is generally constructed as described above. The planarizing step according to the present embodiment that is carried out using the cutting apparatus 30 will be described below.

The wafer 10 is held under suction on the chuck table 36*a* of the cutting apparatus 30 while the protective film L on the face side 10*a* is facing upwardly. The servomotor 33*c* is then energized to rotate the single-point cutting tool mount 33*d* about its central axis in the direction indicated by an arrow R2, and the cutting feed mechanism, not illustrated, is actuated to lower the single-point cutting tool mount 33*d* to a predetermined height where the cutting edge of the single-point cutting tool 34 mounted on the single-point cutting tool mount 33*d* can remove the surface irregularities 18 of the protective film L on the wafer 10. The moving mechanism, not illustrated, is actuated to move the chuck table mechanism 36 in the direction indicated by the arrow R3, causing the chuck table 36*a* with the wafer 10 held thereon to pass through a processing area beneath the single-point cutting tool mount 33*d*. When the chuck table 36*a* with the wafer 10 held thereon passes through the processing area, the surface irregularities 18 are removed from the protective film L on the wafer 10 by the single-point cutting tool 34, as illustrated in a lower inset in FIG. 3. The planarizing step is now completed.

According to the present invention, the planarizing step may not necessarily be performed by the cutting apparatus 30 and may be carried out using a polishing apparatus or the like, for example.

The method of processing a wafer according to the present embodiment, which includes the low-viscosity resin applying step, the high-viscosity resin applying step, the resin curing step, and the planarizing step described above, makes it possible to favourably perform any of various types of division for dividing the wafer 10 into individual device chips as described below. First division among the various types of division will be described below with reference to FIGS. 4A through 4C, 5A, 5B, 13A, and 13B.

Figures 4A, 4B, 4C:
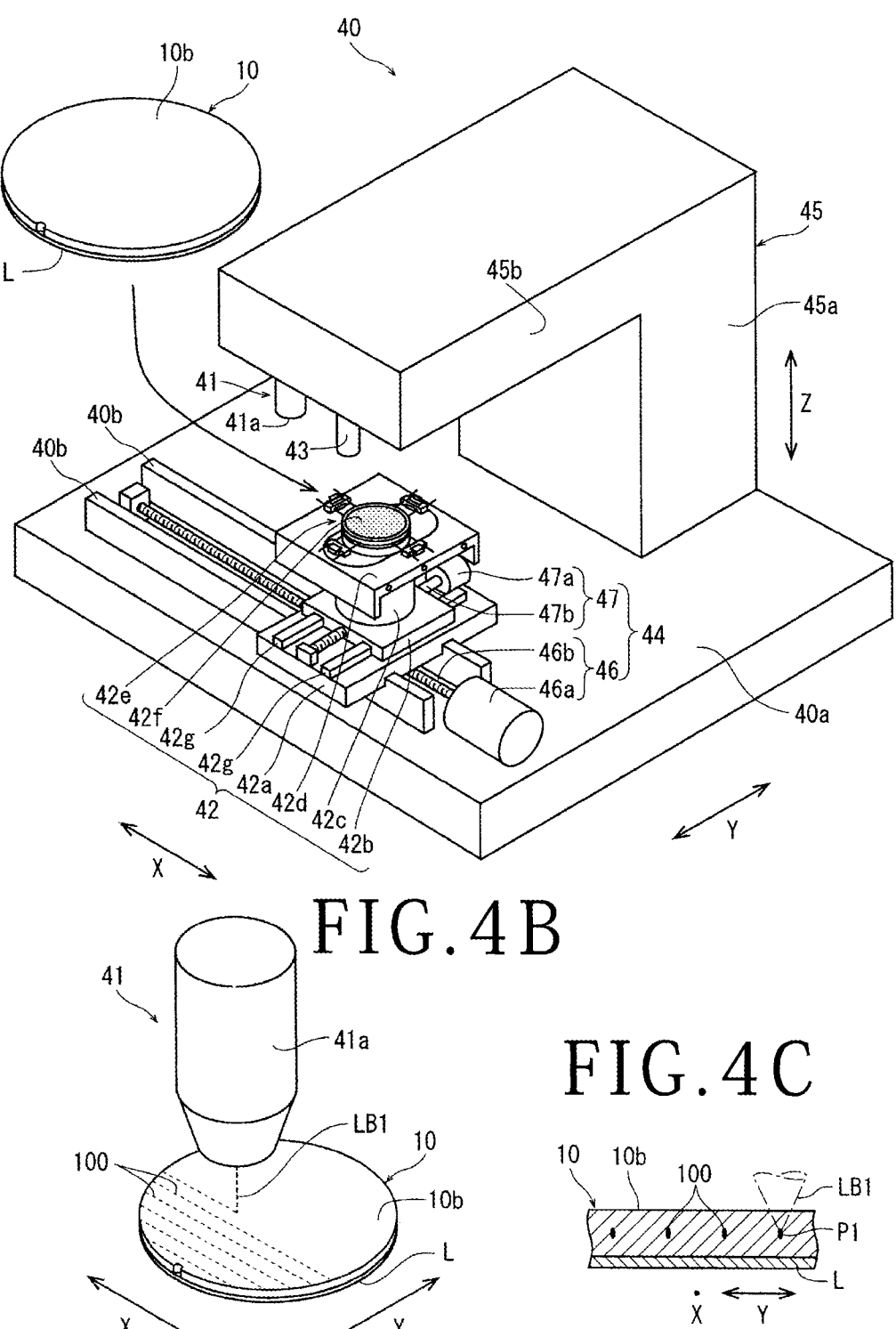
FIG. 4A is a perspective view of a laser processing apparatus.
FIG. 4B is a perspective view illustrating the manner in which a modified layer forming step is carried out.
FIG. 4C is a cross-sectional view of a wafer illustrated in FIG. 4B.

FIG. 4A illustrates in perspective the wafer 10 with the planarized protective film L formed according to the above method of processing a wafer, and a laser processing apparatus 40 suitable for performing the first division. As illustrated in FIG. 4A, the laser processing apparatus 40 includes, on a base table 40*a*, a laser applying unit 41 for applying a laser beam to the wafer 10 as a workpiece, i.e., a target to be processed, a holding unit 42 for holding the wafer 10, an image capturing unit 43 for capturing an image of the wafer 10 held by the holding unit 42, a feed mechanism assembly 44 for processing-feeding and indexing-feeding the laser applying unit 41 and the holding unit 42 relative to each other and moving the image capturing unit 43 and the holding unit 42 relative to each other, and a frame 45 including a vertical wall 45*a* erected from the base table 40*a* behind the feed mechanism assembly 44 and a horizontal wall 45*b* extending horizontally from an upper end portion of the vertical wall 45*a*.

The horizontal wall 45*b* of the frame 45 houses therein an optical system, not illustrated, of the laser applying unit 41. The laser applying unit 41 includes a beam condenser 41*a* disposed on the lower surface of a distal end portion of the horizontal wall 45*b*. The beam condenser 41*a* is movable in Z-axis directions, i.e., vertical directions, indicated by an arrow Z. According to the present embodiment, the laser applying unit 41 is capable of selectively emitting a laser beam having a wavelength transmittable through the wafer 10 and a laser beam having a wavelength absorbable by the wafer 10. The image capturing unit 43 is disposed on the lower surface of the distal end portion of the horizontal wall 45*b* at a position adjacent to the beam condenser 41*a* in X-axis directions, i.e., horizontal directions, indicated by an arrow X. The image capturing unit 43 includes an ordinary visible-light image capturing device such as a charge-coupled device (CCD) for capturing images based on a visible light beam, infrared ray applying means for applying infrared rays to a workpiece, an optical system for capturing infrared rays emitted from the infrared ray applying means, and an image capturing device such as an infrared CCD for outputting an electric signal representing the infrared rays captured by the optical system.

As illustrated in FIG. 4A, the holding unit 42 includes a rectangular X-axis movable plate 42*a* movably mounted on the base table 40*a* for movement in the X-axis directions, a rectangular Y-axis movable plate 42*b* movably mounted on the X-axis movable plate 42*a* for movement in Y-axis directions, i.e., horizontal directions, that are perpendicular to the X-axis directions, a hollow cylindrical support post 42*c* fixedly mounted on an upper surface of the Y-axis movable plate 42*b*, and a rectangular cover plate 42*d* fixedly mounted on an upper end of the support post 42*c*. The cover plate 42*d* has an oblong hole defined therein that accommodates therein a chuck table 42*e* extending upwardly. The chuck table 42*e* is rotatable about its vertical central axis by rotary actuating means, not illustrated, housed in the support post 42*c*. The chuck table 42*e* includes a suction chuck 42*f* in the shape of a circular plate that is made of an air-permeable porous material and that is lying essentially horizontally. The suction chuck 42*f* is fluidly connected to suction means, not illustrated, by a fluid channel extending through the support post 42*c*.

The feed mechanism assembly 44 includes an X-axis feed mechanism 46 and a Y-axis feed mechanism 47. The X-axis feed mechanism 46 converts rotary motion of an electric motor 46*a* into linear motion with a ball screw 46*b* and transmits the linear motion to the X-axis movable plate 42*a*, thereby processing-feeding the X-axis movable plate 42*a* in one of the X-axis directions or the other along a pair of guide rails 40*b* that are disposed on the base table 40*a* and that extend in the X-axis directions. The Y-axis feed mechanism 47 converts rotary motion of an electric motor 47*a* into linear motion with a ball screw 47*b* and transmits the linear motion to the Y-axis movable plate 42*b*, thereby indexing-feeding the Y-axis movable plate 42*b* in one of the Y-axis directions or the other along a pair of guide rails 42*g* that are disposed on the X-axis movable plate 42*a* and that extend in the Y-axis directions.

The laser processing apparatus 40 illustrated in FIG. 4A is generally constructed as described above. A modified layer forming step of the first division, which is carried out using the laser processing apparatus 40, will be described in detail below.

First, as illustrated in FIG. 4A, the wafer 10 is placed and held under suction on the suction chuck 42f of the chuck table 42e while the protective film L formed on the face side 10a is facing downwardly and the reverse side 10b is facing upwardly.

The feed mechanism assembly 44 is actuated to move the wafer 10 held on the chuck table 42e to a position directly below the image capturing unit 43. When the wafer 10 reaches the position directly below the image capturing unit 43, the image capturing unit 43 captures an image of the wafer 10. Specifically, the image capturing unit 43 is electrically connected to a control unit and a display unit, not illustrated. The image capturing unit 43 applies infrared rays to the reverse side 10b of the wafer 10 on the chuck table 42e and captures an image of the wafer 10. The control unit then detects, from the captured image, one of the projected dicing lines 14 to which a laser beam is to be applied on the face side 10a with the protective film L formed thereon. The control unit then stores the X and Y coordinates representing the positional information of the detected projected dicing line 14, and performs alignment processing for turning the chuck table 42e to bring the detected projected dicing line 14 into alignment with the X-axis directions.

After the alignment processing, the X-axis feed mechanism 46 is actuated to move the chuck table 42e in one of the X-axis directions and position the detected projected dicing line 14 of the wafer 10 directly below the beam condenser 41a of the laser applying unit 41, as illustrated in FIG. 4B. Then, at the same time that the X-axis feed mechanism 46 is actuated to processing-feed the chuck table 42e in the X-axis direction, the beam condenser 41a is moved in one of the Z-axis directions to position a focused spot P1 of a laser beam LB1 whose wavelength is transmittable through the wafer 10 within the wafer 10, and the laser applying unit 41 emits and applies the laser beam LB1 to the reverse side 10b of the wafer 10, thereby forming a modified layer 100 in the wafer 10 along the detected projected dicing line 14 that extends in a first direction, as illustrated in FIG. 4C. After the modified layer 100 has been formed in the wafer 10 along the projected dicing line 14, the Y-axis feed mechanism 47 is actuated to indexing-feed the chuck table 42e in one of the Y-axis directions by a distance equal to the interval between adjacent projected dicing lines 14 and to position, directly below the beam condenser 41a of the laser applying unit 41, a next projected dicing line 14 where no modified layer 100 has been formed. Then, at the same time that the X-axis feed mechanism 46 is actuated to processing-feed the chuck table 42e in one of the X-axis directions, the beam condenser 41a is moved in one of the Z-axis directions if necessary to position the focused spot P1 of the laser beam LB1 within the wafer 10, and the laser applying unit 41 emits and applies the laser beam LB1 to the reverse side 10b of the wafer 10, thereby forming a modified layer 100 in the wafer 10 along the next projected dicing line 14 that extends in the first direction.

The above laser processing sequence is repeated to processing-feed the wafer 10 in one of the X-axis directions and indexing-feed the wafer 10 in one of the Y-axis directions, and to apply the laser beam LB1 to the wafer 10 while the wafer 10 is being processing-fed in the X-axis direction, thereby forming modified layers 100 in the wafer 10 along all the projected dicing lines 14 that extend in the first direction. Then, the wafer 10 is turned 90 degrees to align, with the X-axis directions, all the projected dicing lines 14 that extend in a second direction perpendicular to the first direction and that have not undergone the processing. Thereafter, the above laser processing sequence is repeated to form modified layers 100 in the wafer 10 along all the projected dicing lines 14 that extend in the second direction. In this manner, the modified layers 100 are formed in the wafer 10 along all the projected dicing lines 14 established on the face side 10a of the wafer 10. The modified layer forming step is now completed.

Laser processing conditions in the modified layer forming step are set as follows, for example.

Wavelength: 1342 nm

Average output power: 1.0 W

Repetitive frequency: 90 kHz

Feed speed: 700 mm/second

After the modified layer forming step, the wafer 10 is delivered to a grinding apparatus 50 (partly illustrated) illustrated in FIG. 5A to perform a dividing step. As illustrated in FIG. 5A, the grinding apparatus 50 includes a chuck table 51 that is rotatable about its central axis by rotary actuating means, not illustrated, and a grinding unit 52. The grinding unit 52 includes a rotatable spindle 52a that is rotatable by rotary actuating means, not illustrated, a wheel mount 52b mounted on a lower end of the rotatable spindle 52a, and a grinding wheel 52c attached to a lower surface of the wheel mount 52b. A plurality of grindstones 52d are mounted in an annular array on a lower surface of the grinding wheel 52c.

As illustrated in FIG. 5A, the wafer 10 delivered to the grinding apparatus 50 is held under suction on the chuck table 51 while the protective film L formed on the face side 10a is facing downwardly and the reverse side 10b is facing upwardly. Then, the rotatable spindle 52a of the grinding unit 52 is rotated about its central axis in the direction indicated by an arrow R4 at a speed of 6000 rpm, for example, and the chuck table 51 is rotated about its central axis in the direction indicated by an arrow R5 at a speed of 300 rpm, for example. Then, a grinding feed mechanism, not illustrated, coupled to the grinding unit 52 is actuated to lower the grinding unit 52 in the direction indicated by an arrow R6, bringing the grindstones 52d into abrasive contact with the reverse side 10b of the wafer 10. After the grindstones 52d have been brought into abrasive contact with the reverse side 10b of the wafer 10, the grinding feed mechanism grinding-feeds, i.e., lowers, the grinding unit 52 at a grinding feed speed of 1 μm/second, for example. The wafer 10 is ground by the grindstones 52d while the thickness thereof is being measured by a contact-type thickness measuring gage, not illustrated, so that the wafer 10 can be ground to a predetermined finish thickness. Then, external forces are exerted on the ground wafer 10 to divide the wafer 10 into individual device chips 12' along the modified layers 100 formed in the wafer 10 along the projected dicing lines 14, as illustrated in FIG. 5B. At this point, the dividing step comes to an end. The first division is now completed.

Figure 13A:
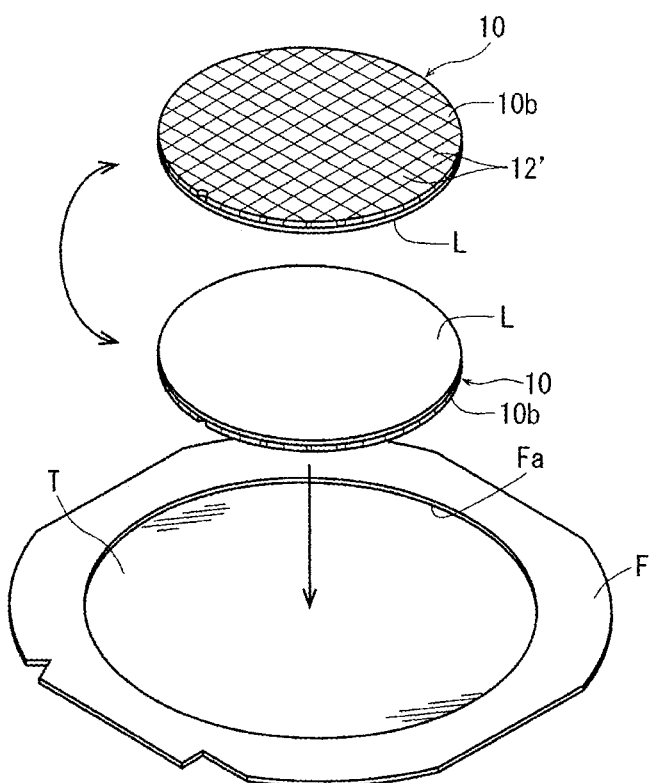
FIG. 13A is a perspective view illustrating the manner in which the wafer that has been divided into individual device chips is supported by an annular frame.
Figure 13B:
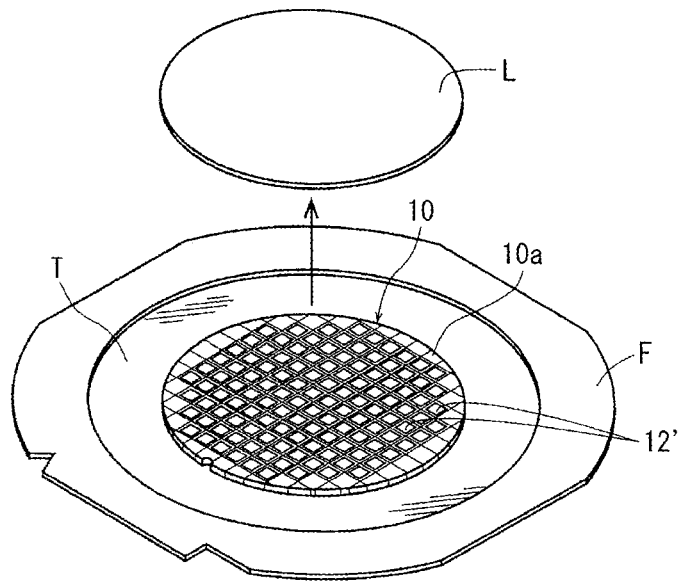
FIG. 13B is a perspective view illustrating the manner in which a protective film is removed from the wafer.

After the wafer 10 has been divided into individual device chips 12' in the first division as described above, the wafer 10 is then sent to a picking-up step, not illustrated, when required. In the picking-up step, as illustrated in FIG. 13A, an annular frame F having an opening Fa capable of accommodating the wafer 10 therein is prepared, and the wafer 10 is turned upside down to orient the protective film L formed on the face side 10a upwardly and to orient the reverse side 10b downwardly and is positioned centrally in the opening Fa. The wafer 10 is held by the annular frame F through an adhesive tape T applied to both of them and interposed therebetween. Then, as illustrated in FIG. 13B, the protective film L is removed from the wafer 10, exposing the face side 10*a* of the wafer 10 that has been divided into the individual device chips 12', so that the individual device chips 12' can readily be picked up.

Prior to the first division, the low-viscosity resin applying step, the high-viscosity resin applying step, the resin curing step, and the planarizing step had already been carried out. Therefore, the first liquid resin L1 that is lower in viscosity flows around protrusions such as bumps and engulfs them, thereby covering the face side 10*a* of the wafer 10 without leaving clearances thereon. Further, the second liquid resin L2 that is higher in viscosity than the first liquid resin L1 and harmonizes well with the first liquid resin L1 is applied in overlapping relation to the first liquid resin L1, forming the protective film L. Therefore, even when the reverse side 10*b* of the wafer 10 is ground and the wafer 10 is divided into individual device chips 12' in the dividing step after the modified layer forming step, swarf does not enter between the device chips 12' and the protective film L, thereby preventing the bumps from being contaminated. In addition, since the thickness of the protective film L had been uniformized in the planarizing step, even when the reverse side 10*b* of the wafer 10 is ground by the grindstones 52*d* and the wafer 10 is divided into individual device chips 12' in the dividing step, the wafer 10 is prevented from being broken.

The various types of division referred to above include second division that can be carried out in combination with the method of processing a wafer that includes the low-viscosity resin applying step, the high-viscosity resin applying step, the resin curing step, and the planarizing step. The second division will be described below with reference to FIGS. 6 through 9.

In the second division, the method of processing a wafer that includes the low-viscosity resin applying step, the high-viscosity resin applying step, the resin curing step, and the planarizing step is performed on the wafer 10. No modified layer forming step has been carried out on the wafer 10, and the wafer 10 with the protective film L formed on the face side 10*a* thereof is delivered to the grinding apparatus 50 described above with reference to FIGS. 5A and 5B to perform a grinding step. As illustrated in FIG. 6, the wafer 10 delivered to the grinding apparatus 50 is held under suction on the chuck table 51 while the protective film L formed on the face side 10*a* is facing downwardly and the reverse side 10*b* is facing upwardly. Then, the rotatable spindle 52*a* of the grinding unit 52 is rotated about its central axis in the direction indicated by the arrow R4 at a speed of 6000 rpm, for example, and the chuck table 51 is rotated about its central axis in the direction indicated by the arrow R5 at a speed of 300 rpm, for example. Then, the grinding feed mechanism, not illustrated, coupled to the grinding unit 52 is actuated to lower the grinding unit 52 in the direction indicated by the arrow R6, bringing the grindstones 52*d* into abrasive contact with the reverse side 10*b* of the wafer 10. After the grindstones 52*d* have been brought into abrasive contact with the reverse side 10*b* of the wafer 10, the grinding feed mechanism grinding-feeds, i.e., lowers, the grinding unit 52 at a grinding feed speed of 1 μm/second, for example. The wafer 10 is ground by the grindstones 52*d* while the thickness thereof is being measured by a contact-type thickness measuring gage, not illustrated, so that the wafer 10 can be ground to a predetermined finish thickness. At this point, the grinding step is ended.

Figure 7A:
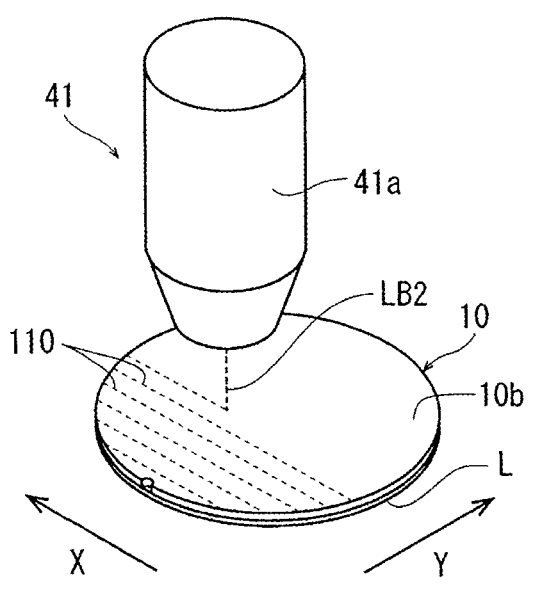
FIG. 7A is a perspective view illustrating the manner in which a modified layer forming step is carried out on the wafer ground in the grinding step illustrated in FIG. 6.
Figure 7B:
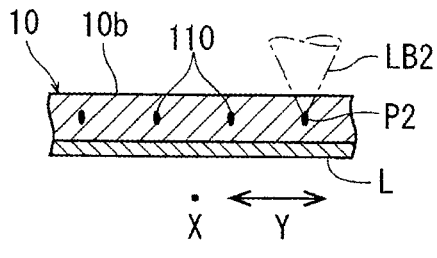
FIG. 7B is an enlarged fragmentary cross-sectional view of the wafer illustrated in FIG. 7A.

After the wafer 10 has been ground to a predetermined finish thickness in the grinding step, the wafer 10 is delivered to the laser processing apparatus 40 described above with reference to FIGS. 4A through 4C to perform the modified layer forming step. The wafer 10 is placed and held under suction on the suction chuck 42*f* of the chuck table 42*e* while the protective film L formed on the face side 10*a* is facing downwardly and the reverse side 10*b* is facing upwardly. The alignment processing described above is performed on the wafer 10, and then, the X-axis feed mechanism 46 is actuated to move the chuck table 42*e* in one of the X-axis directions and position one of the projected dicing lines 14 of the wafer 10 directly below the beam condenser 41*a* of the laser applying unit 41, as illustrated in FIG. 7A. Then, at the same time that the X-axis feed mechanism 46 is actuated to processing-feed the chuck table 42*e* in the X-axis direction, the beam condenser 41*a* is moved in one of the Z-axis directions to position a focused spot P2 of a laser beam LB2 whose wavelength is transmittable through the wafer 10 within the wafer 10, and the laser applying unit 41 emits and applies the laser beam LB2 to the reverse side 10*b* of the wafer 10, thereby forming a modified layer 110 in the wafer 10 along the projected dicing line 14 that extends in a first direction, as illustrated in FIG. 7B. After the modified layer 110 has been formed in the wafer 10 along the projected dicing line 14, the Y-axis feed mechanism 47 is actuated to indexing-feed the chuck table 42*e* in one of the Y-axis directions by a distance equal to the interval between adjacent projected dicing lines 14 and to position, directly below the beam condenser 41*a* of the laser applying unit 41, a next projected dicing line 14 where no modified layer 110 has been formed. Then, at the same time that the X-axis feed mechanism 46 is actuated to processing-feed the chuck table 42*e* in one of the X-axis directions, the beam condenser 41*a* is moved in one of the Z-axis directions if necessary to position the focused spot P2 of the laser beam LB2 within the wafer 10, and the laser applying unit 41 emits and applies the laser beam LB2 to the reverse side 10*b* of the wafer 10, thereby forming a modified layer 110 in the wafer 10 along the next projected dicing line 14.

The above laser processing sequence is repeated to processing-feed the wafer 10 in one of the X-axis directions and indexing-feed the wafer 10 in one of the Y-axis directions, and to apply the laser beam LB2 to the wafer 10 while the wafer 10 is being processing-fed in the X-axis direction, thereby forming modified layers 100 in the wafer 10 along all the projected dicing lines 14 that extend in the first direction. Then, the wafer 10 is turned 90 degrees to align, with the X-axis directions, all the projected dicing lines 14 that extend in a second direction perpendicular to the first direction and that have not undergone the processing. Thereafter, the above laser processing sequence is repeated to form modified layers 110 in the wafer 10 along all the projected dicing lines 14 that extend in the second direction. In this manner, the modified layers 100/110 are formed in the wafer 10 along all the projected dicing lines 14 established on the face side 10*a* of the wafer 10. The modified layer forming step is now completed.

Laser processing conditions in the modified layer forming step of the second division are set as follows, for example.

Wavelength: 1064 nm

Average output power: 1.0 W

Repetitive frequency: 80 kHz

Feed speed: 300 mm/second

Figure 8:
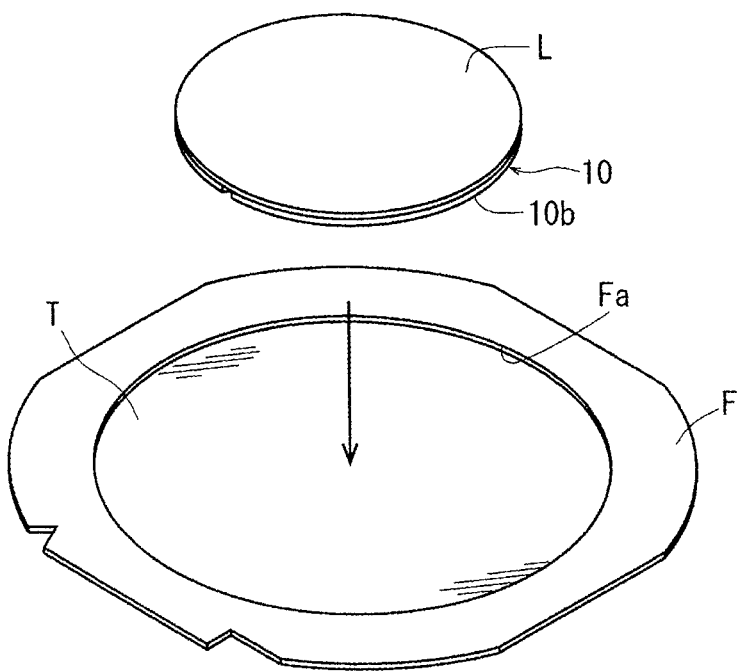
FIG. 8 is a perspective view illustrating the manner in which the wafer that has undergone the modified layer forming step illustrated in FIG. 7A is held by an annular frame.
Figure 9:
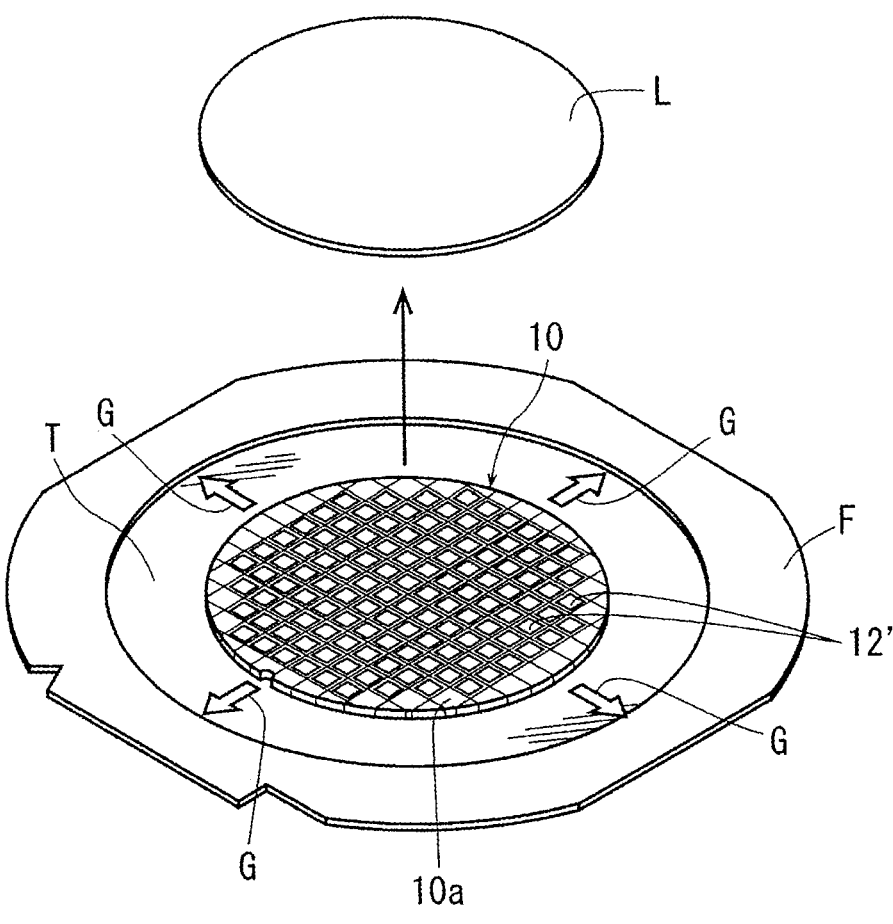
FIG. 9 is a perspective view illustrating the manner in which a dividing step of dividing the wafer into individual device chips by exerting external forces on the wafer is carried out.

After the modified layer forming step, the wafer 10 is delivered from the laser processing apparatus 40. Then, as illustrated in FIG. 8, an annular frame F having an opening Fa capable of accommodating the wafer 10 therein is prepared for performing a dividing step, and the wafer 10 is held by the annular frame F through an adhesive tape T applied to both of them and interposed therebetween while the protective film L formed on the face side 10a is facing upwardly and the reverse side 10b is facing downwardly. After the wafer 10 has been held by the annular frame F, the protective film L is removed from the wafer 10, as illustrated in FIG. 9. After the protective film L has been removed from the wafer 10, external forces G are exerted radially outwardly on the wafer 10 to pull the adhesive tape T in radially outward directions, dividing the wafer 10 into individual device chips 12' along the modified layers 110 that act as division initiating points. At this point, the dividing step is ended. The second division is now completed.

The second division offers the same advantages as with the first division because the low-viscosity resin applying step, the high-viscosity resin applying step, the resin curing step, and the planarizing step have already been carried out. Accordingly, the wafer 10 can well be divided into individual device chips 12' in the second division.

The various types of division referred to above include third division for dividing the wafer 10 into individual device chips. The third division can be carried out in combination with the method of processing a wafer that includes the low-viscosity resin applying step, the high-viscosity resin applying step, the resin curing step, and the planarizing step. The third division will be described below with reference to FIGS. 10A through 10C.

Figure 10A:
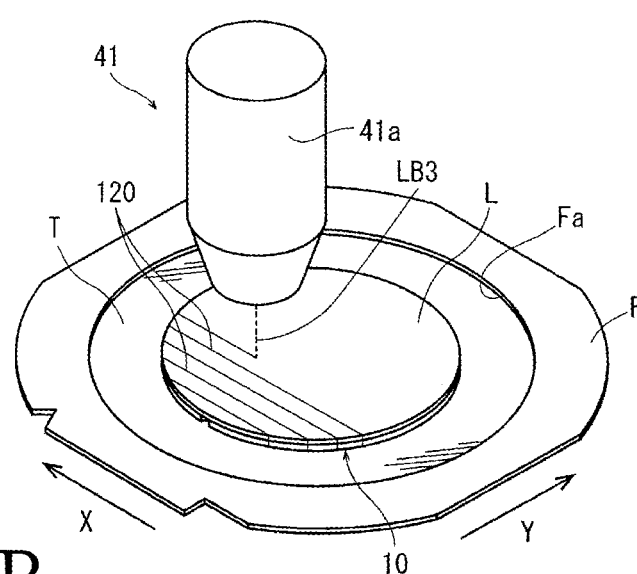
FIG. 10A is a perspective view illustrating the manner in which an ablation processing step is carried out.

After the low-viscosity resin applying step, the high-viscosity resin applying step, the resin curing step, and the planarizing step, in the third division, as illustrated in FIG. 10A, an annular frame F having an opening Fa capable of accommodating the wafer 10 therein is prepared, and the wafer 10 with the protective film L formed on the face side 10a thereof is positioned centrally in the opening Fa with the protective film L facing upwardly. The wafer 10 is held by the annular frame F through an adhesive tape T applied to both of them and interposed therebetween. Since the protective film L is formed on the face side 10a of the wafer 10, the wafer 10 is held on the adhesive tape T with the face side 10a facing upwardly and the reverse side 10b facing downwardly in FIG. 10A.

The wafer 10 is then delivered to the laser processing apparatus 40 described above with reference to FIGS. 4A through 4C to perform a laser ablation step. The wafer 10 is placed and held under suction on the suction chuck 42f of the chuck table 42e while the protective film L formed on the face side 10a is facing upwardly. Then, the alignment processing described above is performed on the wafer 10 held on the chuck table 42e on the basis of an image of the wafer 10 captured by the image capturing unit 43 of the laser processing apparatus 40. Specifically, the control unit detects one of the projected dicing lines 14 formed on the face side 10a, from the captured image. The rotary actuating means, not illustrated, coupled to the chuck table 42e is actuated to turn the wafer 10 to bring the projected dicing line 14 into alignment with the X-axis directions. The control unit, not illustrated, stores the positional information of the detected projected dicing line 14.

Figure 10B:
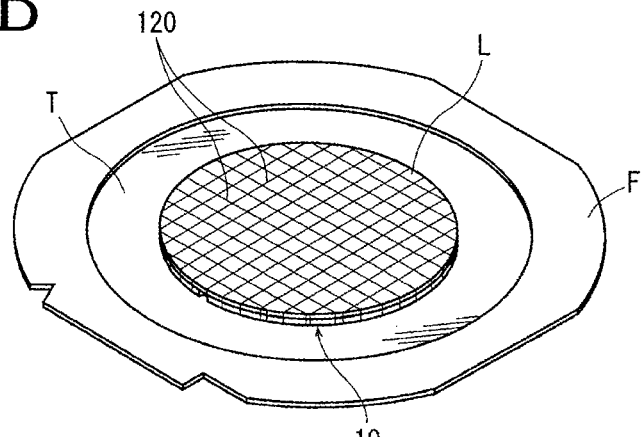
FIG. 10B is a perspective view illustrating the wafer that has been divided into individual device chips in the ablation processing step illustrated in FIG. 10A.

Then, on the basis of the positional information detected in the alignment processing, the beam condenser 41a of the laser applying unit 41 is positioned above the projected dicing line 14 that extends in a first direction, as illustrated in FIG. 10A. At the same time that the X-axis feed mechanism 46 is actuated to processing-feed the chuck table 42e and hence the wafer 10 in one of the X-axis directions, the laser applying unit 41 emits and applies a laser beam LB3 whose wavelength is absorbable by the wafer 10 to the wafer 10 while the beam condenser 41a is moved in one of the Z-axis directions to position a focused spot of the laser beam LB3 on the face side 10a along the projected dicing line 14, thereby forming a dividing groove 120 in protective film L and the wafer 10 along the projected dicing line 14 extending in the first direction by way of laser ablation. The protective film L and the wafer 10 are ruptured along the dividing groove 120. After the dividing groove 120 has been formed in the protective film L and the wafer 10 along the projected dicing line 14, the Y-axis feed mechanism 47 is actuated to indexing-feed the chuck table 42e and hence the wafer 10 in one of the Y-axis directions by a distance equal to the interval between adjacent projected dicing lines 14 and to position, directly below the beam condenser 41a of the laser applying unit 41, a next projected dicing line 14 where no dividing groove 120 has been formed extending in the first direction. Then, at the same time that the X-axis feed mechanism 46 is actuated to processing-feed the chuck table 42e in one of the X-axis directions, the beam condenser 41a is moved in one of the Z-axis directions if necessary to position the focused spot of the laser beam LB3 on the face side 10a along the next projected dicing line 14, and the laser applying unit 41 emits and applies the laser beam LB3 to the wafer 10, thereby forming a dividing groove 120 in the protective film L and the wafer 10 along the next projected dicing line 14. Similarly, dividing grooves 120 are formed in the protective film L and the wafer 10 along all the projected dicing lines 14 that extend in the first direction. Then, the wafer 10 is turned 90 degrees to align, with the X-axis directions, all the projected dicing lines 14 that extend in a second direction perpendicular to the first direction and that have not undergone the processing. Thereafter, the above laser processing sequence is repeated to form dividing grooves 120 in the protective film L and the wafer 10 along all the projected dicing lines 14 that extend in the second direction. In this manner, the dividing grooves 120 are formed in the protective film L and the wafer 10 along all the projected dicing lines 14 established on the face side 10a of the wafer 10, as illustrated in FIG. 10B. The laser ablation step is now completed.

Laser processing conditions in the laser ablation step of the third division are set as follows, for example.

Figure 10C:
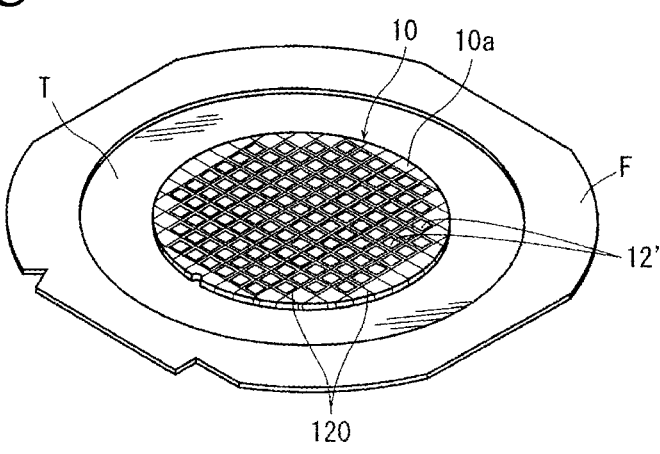
FIG. 10C is a perspective view of the wafer after the removal of a protective film from the wafer illustrated in FIG. 10B.
Figure 1:
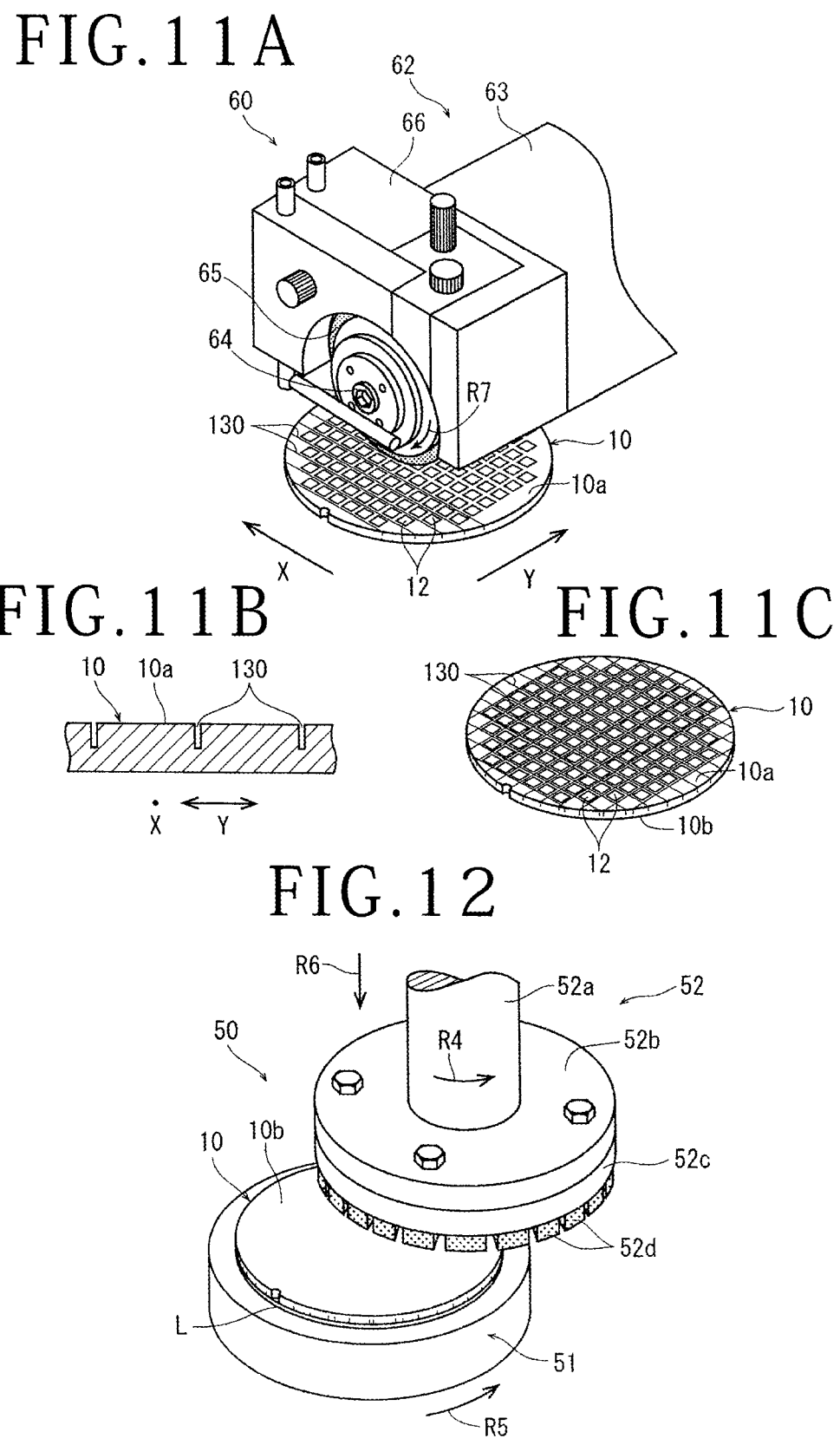

Wavelength: 355 nm
Average output power: 3.0 W
Repetitive frequency: 50 kHz
Feed speed: 10 mm/second As illustrated in FIG. 10B, since the protective film L and the wafer 10 are ruptured along the dividing grooves 120, the wafer 10 is divided into individual device chips 12'. The protective film L is removed as required to expose the face side 10a of the wafer 10, as illustrated in FIG. 10C, making the device chips 12' readily available for pickup. The protective film L may be removed by any of various types of processing. For example, a solvent for dissolving the protective film L may be applied to the surface thereof, or an adhesive tape having appropriate adhesive power may be affixed to the surface of the protective film L and pulled to peel off the protective film L.

The various types of division referred to above include fourth division for dividing the wafer 10 into individual device chips. The fourth division can be carried out in combination with the method of processing a wafer that includes the low-viscosity resin applying step, the high-viscosity resin applying step, the resin curing step, and the planarizing step. The fourth division will be described below with reference to FIGS. 11A through 13B.

In the fourth division, prior to the resin applying step, a groove forming step is carried out to form grooves in the wafer 10 along the projected dicing lines 14 established on the face side 10a of the wafer 10. Specifically, the wafer 10 is delivered to a cutting apparatus 60 illustrated in FIG. 11A. As illustrated in FIG. 11A, the cutting apparatus 60 includes a chuck table, not illustrated, for holding the wafer 10 under suction thereon and a cutting unit 62 for cutting the wafer 10 held under suction on the chuck table. The chuck table is rotatable about its vertical central axis. The cutting apparatus 60 also includes X-axis moving means, not illustrated, for processing-feeding the chuck table and hence the wafer 10 held thereon in an X-axis direction indicated by an arrow X. The cutting unit 62 includes a spindle housing 63, a spindle 64 rotatably supported in the spindle housing 63 for rotation about its horizontal central axis extending parallel to a Y-axis direction indicated by an arrow Y, an annular cutting blade 65 having a diameter of 50 mm, for example, and being held on a distal end of the spindle 64, and a blade cover 66 covering the cutting blade 65. The cutting apparatus 60 further includes Y-axis moving means, not illustrated, for indexing-feeding the cutting blade 65 in the Y-axis direction. The spindle 64 is rotatable by a spindle motor, not illustrated.

For carrying out the groove forming step according to the present embodiment, the wafer 10 is placed and held under suction on the chuck table of the cutting apparatus 60 with the face side 10a facing upwardly. One of the projected dicing lines 14 of the wafer 10 that extend in a first direction is aligned with the X-axis direction and positioned in alignment with the cutting blade 65. Then, the cutting blade 65 that is rotating at a high speed of 30000 rpm, for example, in the direction indicated by an arrow R7 is positioned in alignment with the projected dicing line 14 aligned with the X-axis direction. Then, the cutting blade 65 is forced to cut into the wafer 10 from the face side 10a to a depth terminating short of the reverse side 10b but reaching at least a finish thickness of the devices 12 while a cutting fluid is supplied to the wafer 10 at a rate of 2 liters/minute, for example, and the chuck table is processing-fed in the X-axis direction at a speed of 50 mm/second, for example, thereby forming a groove 130 in the wafer 10 along the projected dicing line 14, as illustrated in FIG. 11B. Thereafter, the cutting blade 65 of the cutting unit 62 is indexing-fed in the Y-axis direction into alignment with a next projected dicing line 14 where no groove 130 has been formed, the next projected dicing line 14 extending in the first direction and being disposed adjacent to the projected dicing line 14 where the groove 130 has just been formed. Then, the cutting blade 65 cuts into the wafer 10, forming a groove 130 in the wafer 10 along the next projected dicing line 14. The above cutting processing is repeated to form grooves 130 in the wafer 10 along all the projected dicing lines 14 that extend in the first direction. Then, the chuck table is turned 90 degrees to align, with the X-axis direction, one of the projected dicing lines 14 of the wafer 10 that extend in a second direction perpendicular to the first direction, and to position the projected dicing line 14 in alignment with the cutting blade 65. The above cutting processing is repeated to form grooves 130 in the wafer 10 along all the projected dicing lines 14 that extend in the second direction. As illustrated in FIG. 11C, grooves 130 are now formed in all the projected dicing lines 14 established on the face side 10a of the wafer 10. The groove forming step is now completed.

After the groove forming step, the low-viscosity resin applying step, the high-viscosity resin applying step, the resin curing step, and the planarizing step described above are carried out. After the planarizing step, the wafer 10 with the planarized protective film L is delivered to a grinding apparatus 50 illustrated in FIG. 12 to perform a dividing step. The grinding apparatus 50 illustrated in FIG. 12 is the same as the grinding apparatus 50 described above with reference to FIG. 6, and will not be described in detail below. The protective film L of the wafer 10 is placed and held under suction on the chuck table 51 of the grinding apparatus 50. As illustrated in FIG. 12, the reverse side 10b of the wafer 10 is ground by the grindstones 52d until the grooves 130 are exposed and the wafer 10 is finished to achieve a finish thickness of the devices 12. As a result, as illustrated in an upper inset in FIG. 13A, the wafer 10 is divided into individual device chips 12'. The dividing step is now completed.

At the time that the wafer 10 is simply divided into the device chips 12', the wafer 10 still remains integral, retaining its shape, on account of the protective film L affixed to the face side 10a. As illustrated in FIG. 13A, an annular frame F having an opening Fa capable of accommodating the wafer 10 therein is prepared, and the wafer 10 is turned upside down to orient the protective film L formed on the face side 10a upwardly and to orient the reverse side 10b downwardly and is positioned centrally in the opening Fa. The wafer 10 is held by the annular frame F through an adhesive tape T applied to both of them and interposed therebetween. Then, as illustrated in FIG. 13B, the protective film L is removed from the wafer 10, exposing the face side 10a of the wafer 10 that has been divided into the individual device chips 12', so that the individual device chips 12' can readily be picked up. When the fourth division is carried out, the low-viscosity resin applying step, the high-viscosity resin applying step, the resin curing step, and the planarizing step are also carried out in combination therewith. Since the protective film L has been uniformized in thickness, when the dividing step is carried out to grind the reverse side 10b of the wafer 10 and divide the wafer 10 into individual device chips 12', the wafer 10 is prevented from being broken.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing a wafer having a plurality of devices, each having a plurality of bumps thereon, formed in respective areas on a face side of the wafer, the areas being demarcated by a plurality of intersecting projected dicing lines, the method comprising:

a first resin applying step of coating the face side of the wafer with a first liquid resin of a sufficient amount to fully engulf the bumps on the devices, thereby covering the face side of the wafer without leaving clearances thereon;

a second resin applying step of, after the first resin applying step, coating the face side of the wafer with a second liquid resin of higher viscosity than the first liquid resin in overlapping relation to the first liquid resin;

a resin curing step of curing the first liquid resin and the second liquid resin that have coated the face side of the wafer into a protective film; and a planarizing step of planarizing the protective film to remove surface irregularities, but without exposing the bumps, and wherein the method further comprises:

a groove forming step of, before the first resin applying step, forming grooves in the wafer along the respective projected dicing lines on the face side of the wafer, wherein the first resin applying step, the second resin applying step, the resin curing step, and the planarizing step are carried out after the groove forming step, and a dividing step of grinding a reverse side of the wafer with grindstones to finish the wafer to a predetermined thickness and dividing the wafer into individual device chips by exposing the grooves is carried out after the planarizing step.

2. The method of processing a wafer according to claim 1, wherein the planarizing step includes the steps of holding a reverse side of the wafer on a chuck table, exposing the face side of the wafer, and cutting the protective film to planarize the protective film with a cutting unit having a single-point cutting tool.

3. The method of processing a wafer according to claim 1, further comprising:

a modified layer forming step of, after the planarizing step, forming modified layers in the wafer along the respective projected dicing lines by applying a laser beam having a wavelength transmittable through the wafer to the wafer from a reverse side of the wafer along the projected dicing lines while positioning a focused spot of the laser beam within the wafer; and a dividing step of grinding the reverse side of the wafer with grindstones to finish the wafer to a predetermined thickness and dividing the wafer into individual device chips along the modified layers.

4. The method of processing a wafer according to claim 1, further comprising:

a grinding step of, after the planarizing step, grinding a reverse side of the wafer with grindstones to finish the wafer to a predetermined thickness;

a modified layer forming step of forming modified layers in the wafer along the respective projected dicing lines by applying a laser beam having a wavelength transmittable through the wafer to the wafer from the reverse side of the wafer along the projected dicing lines while positioning a focused spot of the laser beam within the wafer; and a dividing step of dividing the wafer into individual device chips by exerting external forces to the wafer.

5. The method of processing a wafer according to claim 1, further comprising:

a laser ablation step of, after the planarizing step, performing laser ablation on the wafer along the projected dicing lines by positioning a focused spot of a laser beam having a wavelength absorbable by the wafer on the face side of the wafer along the projected dicing lines and applying the laser beam to the wafer.

6. The method of processing a wafer according to claim 1, wherein the second resin applying step results in the second liquid resin blending with the first liquid resin.

7. The method of processing a wafer according to claim 1, wherein the first liquid resin and the second liquid resin each comprise an epoxy resin.

8. The method of processing a wafer according to claim 7, wherein the resin curing step comprises applying ultraviolet rays to cure the first liquid resin and the second liquid resin.

9. A method of processing a wafer having a plurality of devices, formed in respective areas on a face side of the wafer, the areas being demarcated by a plurality of intersecting projected dicing lines, the method comprising:

a first resin applying step of coating the face side of the wafer with a first liquid resin of a sufficient amount to cover the devices;

a second resin applying step of, after the first resin applying step, coating the face side of the wafer with a second liquid resin of higher viscosity than the first liquid resin in overlapping relation to the first liquid resin;

a resin curing step of curing the first liquid resin and the second liquid resin that have coated the face side of the wafer into a protective film; and a planarizing step of planarizing the protective film, wherein the first liquid resin and the second liquid resin each comprise an epoxy resin, and wherein the resin curing step comprises applying ultraviolet rays to cure the first liquid resin and the second liquid resin, and wherein the method further comprises:

a groove forming step of, before the first resin applying step, forming grooves in the wafer along the respective projected dicing lines on the face side of the wafer, wherein the first resin applying step, the second resin applying step, the resin curing step, and the planarizing step are carried out after the groove forming step, and a dividing step of grinding a reverse side of the wafer with grindstones to finish the wafer to a predetermined thickness and dividing the wafer into individual device chips by exposing the grooves is carried out after the planarizing step.

10. The method of processing a wafer according to claim 9, wherein the planarizing step includes the steps of holding a reverse side of the wafer on a chuck table, exposing the face side of the wafer, and cutting the protective film to planarize the protective film with a cutting unit having a single-point cutting tool.

11. The method of processing a wafer according to claim 9, further comprising:

a modified layer forming step of, after the planarizing step, forming modified layers in the wafer along the respective projected dicing lines by applying a laser beam having a wavelength transmittable through the wafer to the wafer from a reverse side of the wafer along the projected dicing lines while positioning a focused spot of the laser beam within the wafer; and a dividing step of grinding the reverse side of the wafer with grindstones to finish the wafer to a predetermined thickness and dividing the wafer into individual device chips along the modified layers.

12. The method of processing a wafer according to claim 9, further comprising:

a grinding step of, after the planarizing step, grinding a reverse side of the wafer with grindstones to finish the wafer to a predetermined thickness;

a modified layer forming step of forming modified layers in the wafer along the respective projected dicing lines by applying a laser beam having a wavelength transmittable through the wafer to the wafer from the reverse side of the wafer along the projected dicing lines while positioning a focused spot of the laser beam within the wafer; and a dividing step of dividing the wafer into individual device chips by exerting external forces to the wafer.

13. The method of processing a wafer according to claim 9 further comprising:

a laser ablation step of, after the planarizing step, performing laser ablation on the wafer along the projected dicing lines by positioning a focused spot of a laser beam having a wavelength absorbable by the wafer on the face side of the wafer along the projected dicing lines and applying the laser beam to the wafer.

14. The method of processing a wafer according to claim 9, wherein the first liquid resin and the second liquid resin each comprise the same epoxy resin, and further wherein the first liquid resin is mixed with a solvent at a higher ratio than the second liquid resin.

* * * * *